(12) United States Patent
Sakai

(10) Patent No.: US 7,472,319 B2
(45) Date of Patent: Dec. 30, 2008

(54) REMOTE CONTROL SIGNAL RECEIVER AND REMOTE CONTROL SIGNAL RECEIVING METHOD

(75) Inventor: Shogo Sakai, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 466 days.

(21) Appl. No.: 11/035,072

(22) Filed: Jan. 14, 2005

(65) Prior Publication Data

US 2005/0204246 A1 Sep. 15, 2005

(30) Foreign Application Priority Data

Jan. 30, 2004 (JP) ............... 2004-024514

(51) Int. Cl.
*G06F 11/00* (2006.01)
(52) U.S. Cl. ...................... 714/707; 714/700
(58) Field of Classification Search ................. 714/700, 714/707
See application file for complete search history.

(56) References Cited

U.S. PATENT DOCUMENTS

| 3,760,422 | A | * | 9/1973 | Zimmer et al. ......... 340/825.64 |
| 4,486,752 | A | * | 12/1984 | Chihak .................. 340/825.63 |
| 4,617,677 | A | * | 10/1986 | Chiba ......................... 375/340 |
| 4,623,886 | A | * | 11/1986 | Livingston .................. 370/462 |
| 4,692,710 | A | * | 9/1987 | Shvartsman .................. 327/26 |
| 4,763,341 | A | * | 8/1988 | Murphy ........................ 377/20 |
| 4,897,857 | A | * | 1/1990 | Wakatsuki et al. ........... 375/317 |
| 5,313,199 | A | * | 5/1994 | Kwon ..................... 340/825.57 |
| 5,400,022 | A | * | 3/1995 | Montagne ..................... 341/53 |
| 5,406,071 | A | * | 4/1995 | Elms ....................... 250/214 A |
| 5,438,328 | A | * | 8/1995 | Kweon ................... 340/825.63 |
| 6,400,409 | B1 | * | 6/2002 | Wilber ........................ 348/543 |
| 7,120,736 | B2 | * | 10/2006 | Matsushige et al. ......... 711/112 |

FOREIGN PATENT DOCUMENTS

| JP | 63-219226 A | 9/1988 |
| JP | 05-328451 A | 12/1993 |

\* cited by examiner

*Primary Examiner*—M. Mujtaba K Chaudry
(74) *Attorney, Agent, or Firm*—Global IP Counselors, LLP

(57) ABSTRACT

A remote control signal receiver receives a remote control signal in which bit signals are included as pulse signals. The remote control signal receiver includes a remote control signal receiving portion that receives a remote control signal, and a microcomputer. The microcomputer detects a change in a logic level of pulsed signals in the remote control signal, detects a pulse period and a pulse width of the pulse signals of the remote control signal, and determines whether there is an error in the remote control signal based on the detected pulse period and the pulse width of the pulse signals of the remote control signal. It is possible to detect an error in a remote control signal received by the remote control signal receiver.

9 Claims, 7 Drawing Sheets

REMOTE CONTROL SIGNAL RECEIVER AND REMOTE CONTROL SIGNAL RECEIVING METHOD

BACKGROUND OF THE INVENTION

1. Field of the Invention

The present invention relates to a remote control signal receiver for receiving remote control signals transmitted from a remote control signal transmitter, and to a remote control signal distinguishing method for the same. More particularly, the present invention relates to a remote control signal receiver capable of preventing incorrect recognition of remote control signals by detecting errors in received remote control signals, and to a remote control signal distinguishing method for the same.

2. Background Information

In conventional remote control signal transmission method in which a bit signal is detected based on a change in the logic level of a pulse signal, when an infrared remote control signal is received by an infrared receiver element that does not have very good reception performance, the remote control signal received by the infrared receive element is not always the same as the one transmitted from the remote control signal transmitter. Instead, the remote control signal as received by the infrared receive element sometimes includes distortions, whereby high- or low-level pulse signals that were in the remote control signal when it was transmitted from the remote control signal transmitter become lost. Accordingly, when some of the high- or low-level pulsed signals of a remote control signal are lost due to a distortion, the bit signals of the remote control signal are incorrectly recognized, causing the electronic device to malfunction.

As an example of such conventional arrangement, there has been known a remote control signal transmission method in which the rise signals and fall signals that indicate a change in the logic level of the received remote control signal are counted. The count is then compared with predetermined data that determine whether or not signals of the remote control signal fit into predetermined logic levels. A flip-flop is set or reset according to this comparison result. More specifically, if the received remote control signal includes abnormal data, which are data that do not fit into the predetermined logic levels, a reset signal is outputted from the flip-flop, but if the received remote control signal only includes normal data, which are data that fit into one of the predetermined logic levels, reception data and reception detection data are outputted. Japanese Laid-Open Patent Application H5-328451 discloses such remote control signal transmission method.

However, in such conventional arrangement, the error detection is performed by data processing hardware, rather than software. Therefore, the cost of installing such error detection function in a remote control signal receiver is high. It is also difficult to make modifications in such hardware-based error detection functions.

In view of the above, it will be apparent to those skilled in the art from this disclosure that there exists a need for improved remote control signal receiver and remote control signal distinguishing method that overcome the problems of the conventional art described above. This invention addresses this need in the art as well as other needs, which will become apparent to those skilled in the art from this disclosure.

SUMMARY OF THE INVENTION

It is an object thereof to provide a remote control signal receiver which can detect a remote control signal that includes an error, and a remote control receiving method by which a remote control signal that includes an error can be detected.

In order to achieve the stated object, a remote control signal receiver in accordance with a first aspect of the present invention is adapted to receive a remote control signal in which bit signals are included as pulse signals. The remote control signal receiver includes a remote control signal receiving portion adapted to receive a remote control signal; and a microcomputer operatively coupled to the remote control signal receiving portion. The microcomputer is configured to detect a change in a logic level of pulsed signals in the remote control signal, detect a pulse period and a pulse width of the pulse signals of the remote control signal, and determine whether there is an error in the remote control signal based on the detected pulse period and the pulse width of the pulse signals of the remote control signal.

Preferably, in the remote control signal receiver of the present invention, the microcomputer is configured to determine whether there is an error in the remote control signal by determining whether the detected pulse period is one of predetermined pulse periods.

Preferably, in the remote control signal receiver of the present invention, the microcomputer is configured to determine whether there is an error in the remote control signal by determining whether the detected pulse width is one of the predetermined pulse widths, the predetermined pulse widths being determined for each of the predetermined pulse periods.

Preferably, in the remote control signal receiver of the present invention, the microcomputer is configured to interpret the remote control signal as a bit signal based on the pulse period of the pulse signals of the remote control signal.

Preferably, in the remote control signal receiver of the present invention, the microcomputer is configured to interpret the remote control signal as a bit signal based also on the pulse width of the pulse signals of the remote control signal.

Preferably, in the remote control signal receiver of the present invention, the microcomputer is further configured to set and reset a flag indicating whether or not a change in the logic level of the pulse signals due to a falling pulse signal.

Preferably, in the remote control signal receiver of the present invention, the microcomputer is configured to determine whether there is an error in the remote control signal when the flag indicates that the logic level of the pulse signals is due to a falling pulse signal.

According to a remote control signal receiving method in accordance with a second aspect of the present invention, the remote control signal receiving method receives a remote control signals in which bit signals are included as pulse signals. The remote control signal receiving method includes steps of receiving a remote control signal, detecting a change in a logic level of pulse signals of the remote control signal, determining whether or not the change in the logic level of the pulse signals is due to a falling pulse signal, detecting a pulse period and a pulse width of the pulse signals of the remote control signal, determining whether there is an error in the remote control signal based on the detected pulse period and the pulse width of the pulse signals of the remote control signal when the change in the logic level is due to predetermined either one of a falling pulse signal and a rising pulse signal, and interpreting the remote control signal as a bit signal if there is no error in the remote control signal.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 1:
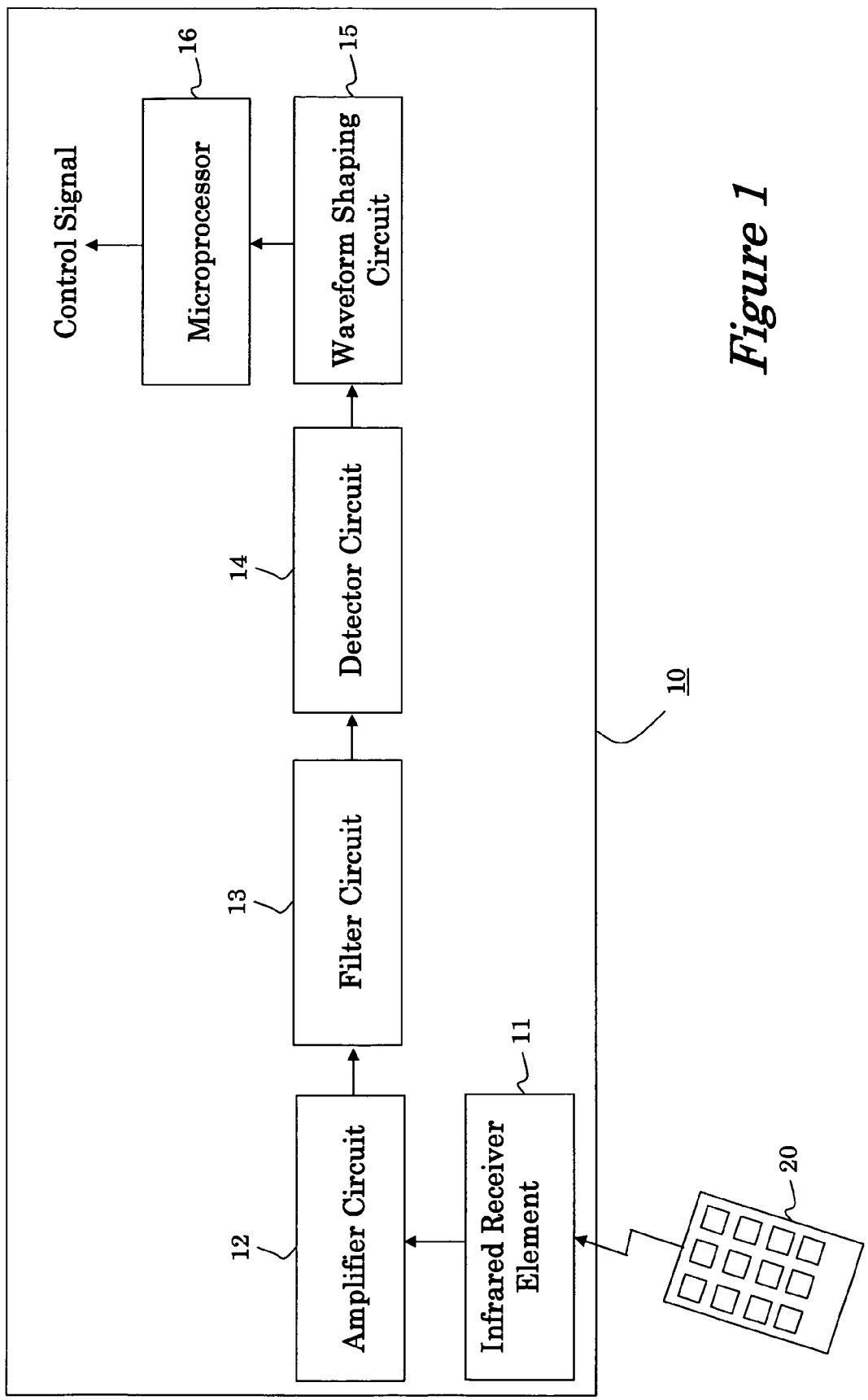
FIG. 1 is a schematic diagram illustrating the remote control signal receiver in an example of the present invention.
Figure 2:
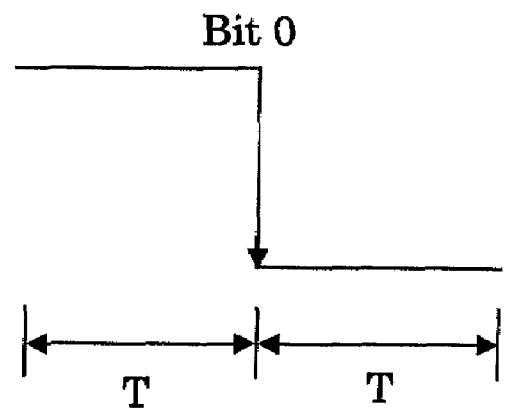
FIGS. 2a and 2b are schematic diagrams illustrating bit signals of the remote control signal for the remote control signal receiving method in an example of the present invention.
Figure 2:
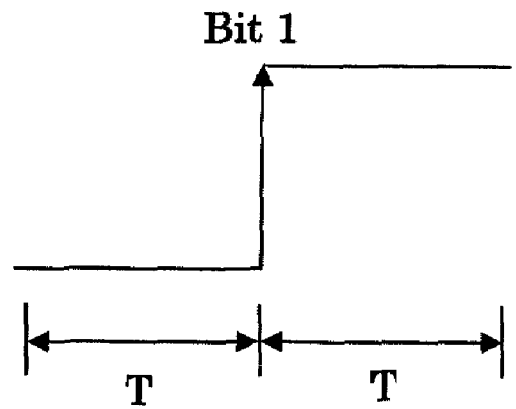
Figure 3:
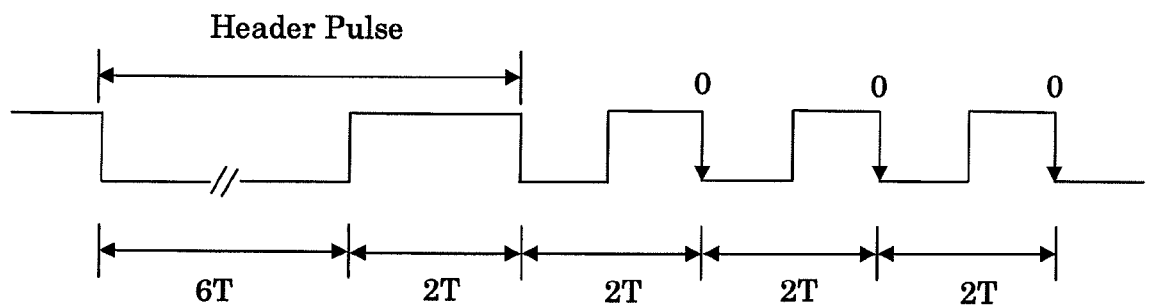
FIGS. 3a and 3b are schematic diagrams illustrating remote control signals to be received for the remote control signal receiving method in an example of the present invention.
Figure 3:
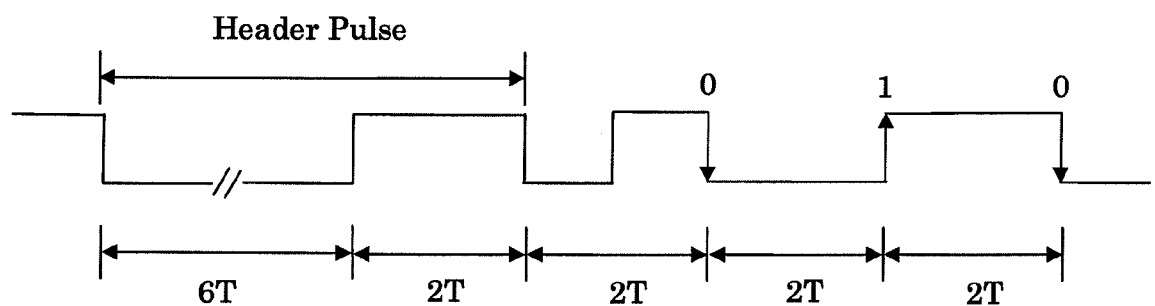
Figure 4:
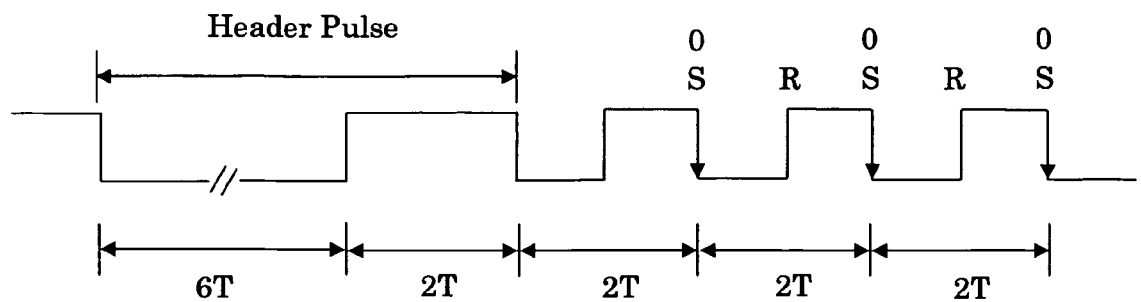
FIGS. 4a-c are schematic diagrams illustrating the remote control signals received by the remote control signal receiver in an example of the present invention, FIG. 4a showing the remote control signal received correctly and FIGS. 4b and 4c showing the remote control signals received with distortions.
Figure 4:
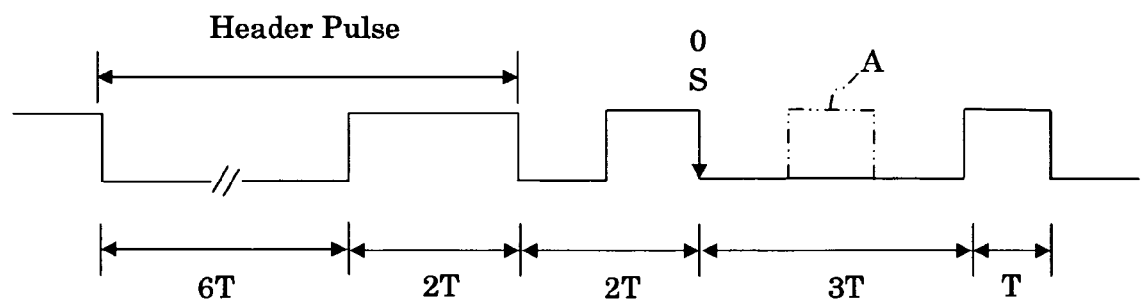
Figure 4:
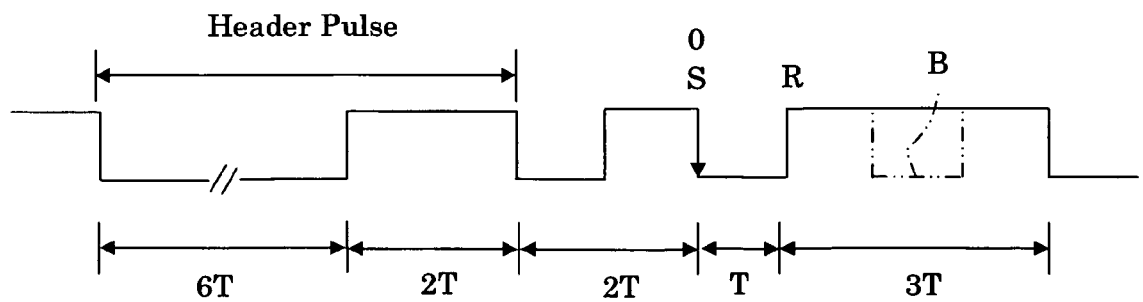
Figure 5:
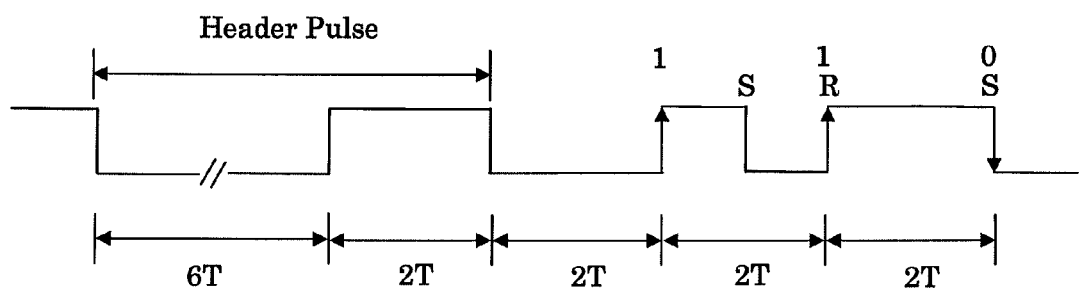
FIGS. 5a-c are schematic diagrams illustrating the remote control signals received by the remote control signal receiver in an example of the present invention, FIG. 5a showing the remote control signal received correctly and FIGS. 5b and 5c showing the remote control signals received with distortions.
Figure 5:
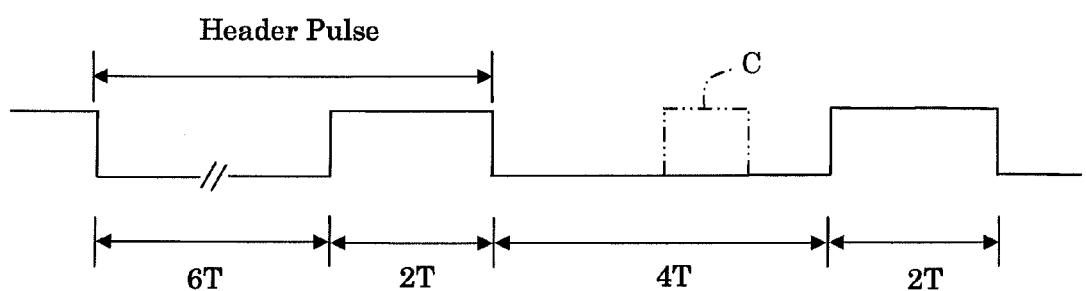
Figure 5:
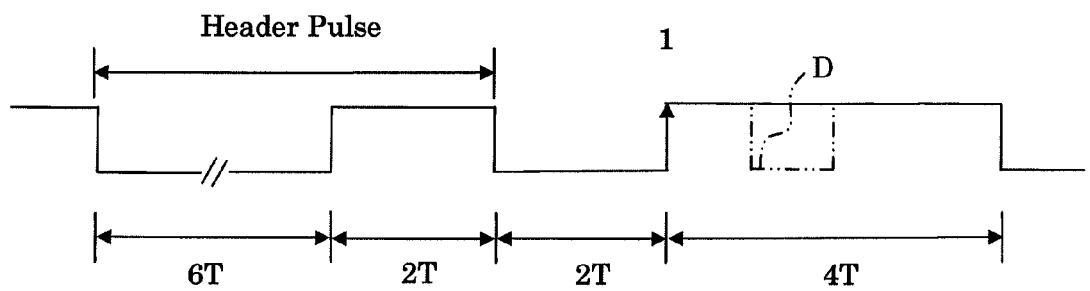
Figure 6:
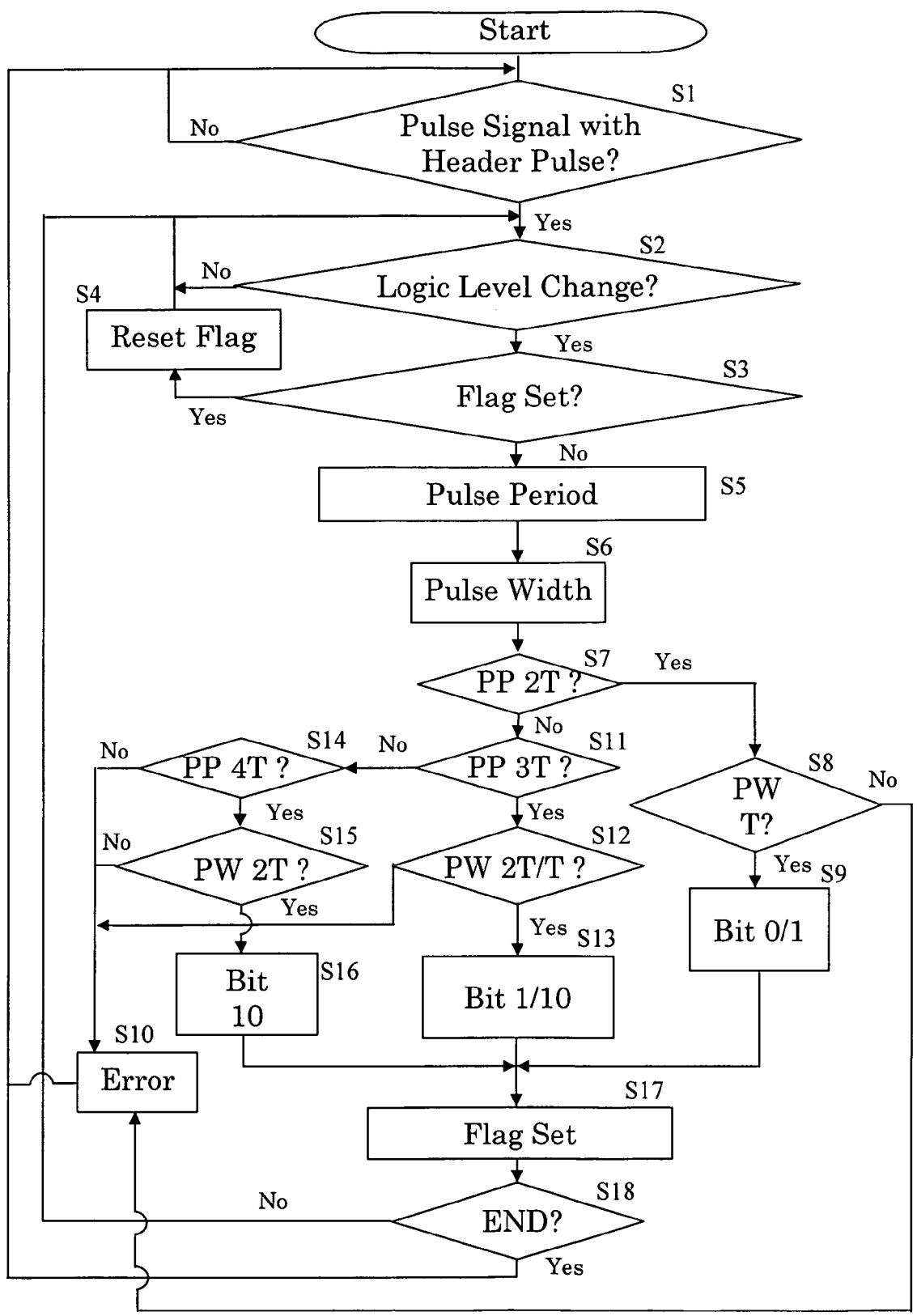
FIG. 6 is a flowchart illustrating the operation of the remote control signal receiving method in an example of the present invention.

The preferred mode for carrying out the invention will now be described in detail through reference to the drawings. FIG. 1 is a block diagram illustrating the remote control signal receiver in accordance with an embodiment of the present invention. FIG. 2 is a diagram illustrating the bit signal of a remote control signal of the remote control signal receiver in accordance with an embodiment of the present invention. FIG. 3 is a diagram illustrating the remote control signal of the remote control signal receiver in accordance with an embodiment of the present invention. FIG. 4 is a diagram illustrating the received remote control signal of the remote control signal receiver in accordance with an embodiment of the present invention. FIG. 5 is a diagram illustrating the received remote control signal of the remote control signal receiver in accordance with an embodiment of the present invention. FIG. 6 is a flowchart illustrating the operation of the remote control signal receiver in accordance with an embodiment of the present invention.

Referring initially to FIG. 1, a remote control signal receiver 10 is illustrated in accordance with a first embodiment of the present invention.

A remote control signal receiver 10 includes an infrared receiver element 11, an amplifier circuit 12, a filter circuit 13, a detector circuit 14, a waveform shaping circuit 15, and a microprocessor 16. The infrared receiver element 11 receives an infrared remote control signal transmitted from a remote control signal transmitter 20. The amplifier circuit 12 that converts the infrared remote control signal received by the infrared receiver element 11 into a predetermined electrical signal and amplifies the remote control signal that has been thus converted into the electrical signal. The filter circuit 13 removes any high-frequency noise included in the remote control signal amplified by the amplifier circuit 12. The detector circuit 14 detects and reproduces the remote control signal from which the high-frequency noise has been removed by the filter circuit 13. The waveform shaping circuit 15 shapes the waveform of the remote control signal detected by the detector circuit 14. The microprocessor 16 distinguishes the remote control signal whose waveform has been shaped by the waveform shaping circuit 15 and outputs a control signal. The microcomputer 16 includes a program that performs the error detection and bit recognition functions as discussed below.

The operation of the remote control signal receiver constituted as above will now be described.

The remote control signal transmitter 20 transmits to the remote control signal receiver 10 of the present embodiment a remote control signal including bit signals as shown in FIG. 2.

In one of the known remote control signal receiving methods, remote control signals are interpreted based on pulse period between the falling pulse signals only when falling pulse signals are detected. As shown in FIG. 2a, the bit 0 signal is a falling pulse signal in which the logic level changes from a high logic level pulse having a width T to a low logic level pulse having a width T. As shown in FIG. 2b, the bit 1 signal is a rising pulse signal in which the logic level changes from a low-level pulse signal having a pulse width T to a high-level pulse signal having a pulse width T. In other words, a bit signal of this remote control signal receiving method has a pulse width of 2T.

Figure 7:
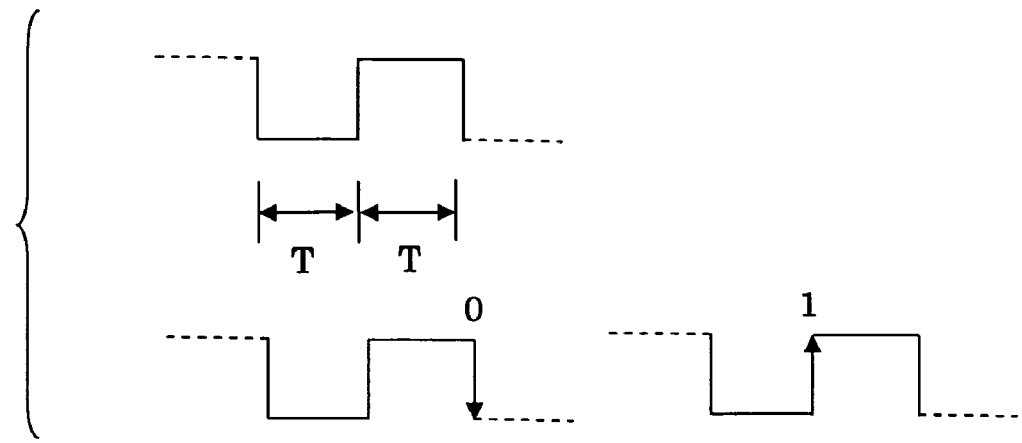
FIGS. 7a-c are schematic diagrams illustrating remote control signals having different pulse periods.
Figure 7:
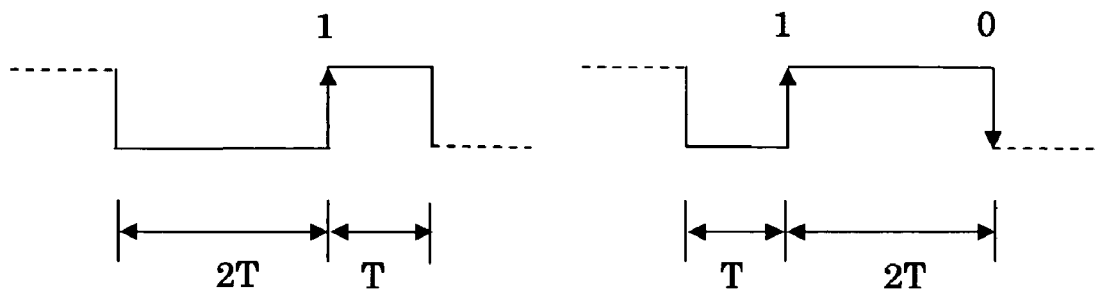
Figure 7:
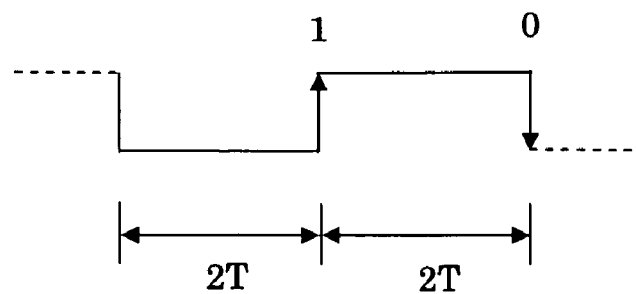

FIG. 7 shows examples of how the remote control signal receiver receives a remote control signal using this remote control signal receiving method. FIG. 7a shows two falling pulse signals with a pulse period of 2T, FIG. 7b shows two falling pulse signals with a pulse period of 3T, FIG. 7c shows two falling pulse signals with an in-between time period of 4T. Since a bit signal with a falling pulse signal shown in FIG. 2a indicates "0," and a rising pulse signal shown in FIG. 2b indicates "1," the falling pulse signals shown in FIG. 7a indicate "0" or "1," depending on whether the falling pulse signals are bit signals or not. Also, the pulse signals shown in FIG. 7b indicate "01" or "10," depending on whether the falling pulse signals are bit signals or not. Similarly, the pulse signals shown in FIG. 7c indicate "010." In this manner, bit signals are interpreted based on the pulse period between the falling pulse signals in this remote control signal receiving method.

A remote control signal whose bit signals are to indicate "000" is shown in FIG. 3a as an example. When the remote control signal shown in FIG. 3a is transmitted from the remote control signal transmitter, a header pulse composed of a low logic level pulse having a pulse width of 6T and a high logic level pulse amplitude having a pulse width of 2T is initially transmitted. After the header pulse, the bit signals of "000" are transmitted one by one. In the case of a remote control signal whose bit signals are to indicate "010" as shown in FIG. 3b, the header pulse signal composed of a low logic level pulse with a pulse width of 6T and a high logic level pulse with a pulse width of 2T is initially transmitted, after which the bit signals of "010" are transmitted one by one.

However, there are times when the high-level pulse A that was supposed to be in the received remote control signal becomes lost as shown in FIG. 4b, or when the low-level pulse signal B that was supposed to be in the received remote control signal becomes lost as shown in FIG. 4c, while the remote control signal of "000" bit signals shown in FIG. 4a is transmitted from the remote control signal transmitter. Also, when a remote control signal of "110" bit signals is transmitted from the remote control signal transmitter as shown in FIG. 5a, there are times when the high-level pulse signal C that was supposed to be in the received remote control signal is lost as shown in FIG. 5b, or when the low-level pulse signal D that was supposed to be in the received remote control signal is lost as shown in FIG. 5c.

Since the conventional remote control signal receiving method does not have an error detection function, remote control signals containing errors when received by the remote control signal receiver are interpreted in an inaccurate manner. For example, in the cases of FIGS. 4b and 4c, the pulse period between the two falling pulse signals is 4T, the bit signals of these remote control signals are interpreted as "010," instead of "000." Thus, the remote control signals are interpreted incorrectly.

The remote control signal receiving method in accordance with the present embodiment will now be described referring to FIG. 6.

When the remote control signal receiver 10 receives signals from the remote control signal transmitter 20, the microprocessor 16 of the remote control signal receiver 10 in step S1 decides whether the received signal includes a header pulse indicating that the received signal is a remote control signal. If the received signal includes the header pulse, the microprocessor 16 proceeds to step S2. Otherwise, the microprocessor 16 repeats the step S1 until signals that include the header pulse are received.

In step S2, the microprocessor 16 determines whether or not there is a change in the logic level after the header pulse. If there is a change in the logic level, the microprocessor 16 proceeds to step S3. Otherwise, the microprocessor 16 repeats the step S2 until there is a change in the logic level.

In step S3, the microprocessor 16 determines if the flag is set. If the flag is set, then the microprocessor 16 proceeds to step S4 and resets the flag. After step S4, the microprocessor 16 returns to step S2 and waits for another change in the logic level. If the flag is not set, the microprocessor 16 proceeds to step S5. This flag indicates whether the change in the logic level detected in step S2 is due to a bit signal. In this embodiment, the flag is configured such that the flag is set after the falling pulse signal at the end of the header pulse. In other words, the flag is configured so as to be set with a falling pulse signal, and reset with a rising pulse signal, as indicated by "S" and "R" in FIG. 4a. Therefore, whenever the microprocessor 16 proceeds from step S3 to step S5, the logic level change detected in step S2 is always due to a falling pulse signal. The remote control signal receiving method of the present invention can be, however, alternatively configured such that the flag is set after each rising pulse signal, and reset after each falling pulse signal.

In step S5, the microprocessor 16 detects the pulse period of the falling pulse signal detected in step S2. The microprocessor 16 calculates the total length of the pulse periods since the falling pulse signal at the end of the header pulse. The microprocessor 16 proceeds to step S6.

In step S6, the microprocessor 16 detects a pulse width of the falling pulse signal detected in step S2. The pulse width is the duration of the high logic level pulse immediately preceding the falling pulse signal detected in step S2. The microprocessor 16 then proceeds to step S7.

In step S7, the microprocessor 16 determines whether the pulse period detected in step S5 is 2T. If the pulse period is 2T, the microprocessor 16 proceeds to step S8. Otherwise, the microprocessor 16 proceeds to step S11.

In step S8, the microprocessor 16 determines whether the pulse width of the falling pulse signal detected in step S6 is T. If the pulse width is T, the microprocessor 16 proceeds to step S9. If the pulse width is not T, there is a distortion in the remote control signal. Thus, the microprocessor 16 determines in step S10 that there was an error, returns to step S1 and waits for another signal.

In step S9, the microprocessor 16 determines the bit signal indicated by the remote control signal. More specifically, if the total length of the pulse periods as of the time the falling pulse signal is detected in step S2 is an even number (for instance. 2T, 4T, 12T) the falling pulse signal is interpreted to indicate a bit signal of "0." On the other hand, if the total length of the pulse periods as of the time the falling pulse signal is detected in step S2 is an odd number (for instance. 3T, 5T, 13T) the falling pulse signal is interpreted to indicate a bit signal of "1." The microprocessor 16 then proceeds to step S17.

In step S11, the microprocessor 16 determines whether the pulse period detected in step S5 is 3T. If the pulse period is 3T, the microprocessor 16 proceeds to step S12. Otherwise, the microprocessor 16 proceeds to step S14.

In step S12, the microprocessor 16 determines whether the pulse width of the falling pulse signal detected in step S6 is T or 2T. More specifically, the microprocessor 16 determines whether the pulse width is T when the total length of the pulse periods is an odd number as of the time the falling pulse signal is detected in step S2, or the pulse width is 2T when the total length of the pulse periods is an even number as of the time the falling pulse signal detected is detected in step S2. If the pulse width and the total length of the pulse periods satisfy either of these criteria, the microprocessor 16 proceeds to step S13. If the pulse width and the total length of the pulse periods do not satisfy either of these criteria, there is a distortion in the remote control signal. Thus, the microprocessor 16 determines in step S10 that there was an error in the remote control signal, returns to step S1, and waits for another signal.

In step S13, the microprocessor 16 interprets the bit signal indicated by the remote control signal. More specifically, if the total length of the pulse periods as of the time the falling pulse signal is detected in step S2 is an even number in step S12, the falling pulse signal is interpreted to indicate a bit "1." On the other hand, if the total length of the pulse periods as of the time the falling pulse signal is detected in step S2 is an odd number in step S12, the falling pulse signal is interpreted to indicate a bit "10." The microprocessor 16 then proceeds to step S17.

In step S14, the microprocessor 16 determines whether the pulse period detected in step S5 is 4T. If the pulse period is 4T, the microprocessor 16 proceeds to step S15. Otherwise, the microprocessor 16 proceeds to step S10, where it is determined that there was an error in the remote control signal. This is because, in this remote control signals in which bit signals occur at every 2T, the pulse period of a falling pulse signal has to be 2T, 3T, or 4T for the remote control signal to be without an error. After step S10, the microprocessor 16 returns to step S1 and waits for another signal.

In step S15, the microprocessor 16 determines whether the pulse width of the falling pulse signal detected in step S6 is 2T and whether the total length of the pulse periods is an even number as of the time the falling pulse signal is detected in step S2. If the pulse width and the total length of the pulse periods satisfy these criteria, the microprocessor 16 proceeds to step S16. If the pulse width and the total length of the pulse periods do not satisfy these criteria, there is a distortion in the remote control signal. Thus, the microprocessor 16 determines in step S10 that there was an error in the remote control signal, returns to step S1 and waits for another signal.

In step S16, the microprocessor 16 interprets that the bit signal indicated by the falling pulse signal is "10." The microprocessor 16 then proceeds to step S17, where the flag is set. The microprocessor 16 further proceeds to step S18, and determines whether the falling pulse signal is the end of the remote control signal. If the falling pulse signal is the end of the remote control signal, the microprocessor 16 returns to step S1 and waits for another signal. If the falling pulse signal is the end of the remote control signal, the microprocessor 16 returns to step S2 and waits for another logic level change.

With the above-described remote control receiving method, it is possible to detect an error in the remote control signals shown in FIGS. 4b, 4c, 5b, and 5c. The manner in which the remote control receiving method of the present embodiment detects an error will be explained with reference to the flow chart of FIG. 6, starting at step S2, where a logic level change due to the last (rightmost) falling pulse signals shown in FIGS. 4b, 4c, 5b, and 5c has been detected.

At step S3, since the flag has been reset with the immediately preceding rising pulse signal in each of the signals shown in FIGS. 4b, 4c, 5b, and 5c, the flag is not set. Therefore, the microprocessor 16 proceeds to step S5.

At step S5, the pulse periods are 4T for the remote control signals of FIGS. 4b and 4c, and 6T for the remote control signals of FIGS. 5b and 5c. At step S6, the pulse widths are T for the remote control signal of FIG. 4b, 3T for the remote control signal of FIG. 4c, 2T for the remote control signal of FIG. 5b, and 4T for the remote control signal of FIG. 5c.

Clearly, the remote control signals of FIGS. 5b and 5c are determined to be errors at step S14, since their pulse periods are longer than 4T. Also, the remote control signals of FIGS. 4b and 4c are determined to be errors at step S15, because their pulse widths are not 2T. In this manner, the distortions in the remote control signals of FIGS. 4b, 4c, 5b, and 4c can be detected with the remote control signal receiving method of the present embodiment.

With the remote control signal receiver and the remote control signal receiving method of the present invention, it is possible to prevent incorrect recognition of remote control signals by detecting errors in remote control signals received by the remote control signal receiver.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-024514. The entire disclosure of Japanese Patent Application No. 2004-024514 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A remote control signal receiver comprising:
    a remote control signal receiving portion configured to receive a remote control signal in which bit signals are included as pulse signals; and
    a microcomputer operatively coupled to the remote control signal receiving portion and configured to detect a change in a logic level of the pulse signals in the remote control signal, detect a pulse period and a pulse width of the pulse signals of the remote control signal, and determine from at least one of the pulse signals that were received in the remote control signal whether one of the pulse signals of the remote control signal is lost in the remote control signal by determining whether the pulse period of the at least one of the pulse signals that were received in the remote control signal is one of predetermined pulse periods and by determining whether the pulse width of the at least one of the pulse signals that were received in the remote control signal is one of predetermined pulse widths.

2. The remote control signal receiver according to claim 1, wherein
    the predetermined pulse widths are determined for each of the predetermined pulse periods.

3. The remote control signal receiver according to claim 1, wherein
    the microcomputer is configured to interpret the remote control signal as a bit signal based on the pulse period of the pulse signals of the remote control signal.

4. The remote control signal receiver according to claim 3, wherein
    the microcomputer is configured to interpret the remote control signal as a bit signal based also on the pulse width of the pulse signals of the remote control signal.

5. A remote control signal receiver comprising:
    a remote control signal receiving portion configured to receive a remote control signal in which bit signals are included as pulse signals; and
    a microcomputer operatively coupled to the remote control signal receiving portion and configured to detect a change in a logic level of the pulse signals in the remote control signal, detect a pulse period and a pulse width of at least one of the pulse signals that were received in the remote control signal, and determine whether there is an error in the remote control signal based on the pulse period and the pulse width of the at least one of the pulse signals that were received in the remote control signal, the microcomputer being further configured to set and reset a flag indicating whether or not a change in the logic level of the pulse signals is due to a falling pulse signal, and determine whether there is an error in the remote control signal when the flag is not set.

6. The remote control signal receiver according to claim 5, wherein the microcomputer is configured to determine whether there is an error in the remote control signal when the flag indicates that the logic level of the pulse signals is due to a falling pulse signal.

7. A remote control signal receiver comprising:

remote control signal receiving means for receiving a remote control signal in which bit signals are included as pulse signals;

logic level detection means for detecting a change in the logic level of the pulse signals of the remote control signal;

pulse period detection means for detecting a pulse period of the pulse signals of the remote control signal;

pulse width detection means for detecting a pulse width of the pulse signals of the remote control signal;

error determining means for determining from at least one of the pulse signals that were received in the remote control signal whether one of the pulse signals of the remote control signal is lost in the remote control signal by determining whether the pulse period of the at least one of the pulse signals that were received in the remote control signal is one of predetermined pulse periods and by determining whether the pulse width of the at least one of the pulse signals that were received in the remote control signal is one of predetermined pulse widths; and bit interpreting means for determining the remote control signal as a bit signal based on the detected pulse period.

8. A remote control signal receiver comprising:

remote control signal receiving means for receiving a remote control signal in which bit signals are included as pulse signals;

logic level detection means for detecting a change in the logic level of the pulse signals of the remote control signal;

pulse period detection means for detecting a pulse period of at least one of the pulse signals that were received in the remote control signal;

pulse width detection means for detecting a pulse width of the at least one of the pulse signals that were received in the remote control signal;

error determining means for determining whether there is an error in the remote control signal based on a combination of the pulse period and the pulse width of the at least one of the pulse signals that were received in the remote control signal;

bit interpreting means for determining the remote control signal as a bit signal based on the pulse period of the at least one of the pulse signals that were received in the remote control signal; and flag setting means for setting and resetting a flag indicating whether or not a change in the logic level of the pulse signals is due to a falling pulse signal;

the error determining means determining whether there is an error in the remote control signal when the logic level detection means detects a change in the logic level of the pulse signals of the remote control signal and the flag is not set.

9. A remote control signal receiving method comprising:

receiving a remote control signal in which bit signals are included as pulse signals;

detecting a change in a logic level of the pulse signals of the remote control signal;

determining whether or not the change in the logic level of the pulse signals is due to a falling pulse signal;

detecting a pulse period and a pulse width of the pulse signals of the remote control signal;

determining from at least one of the pulse signals that were received in the remote control signal whether one of the pulse signals of the remote control signal is lost in the remote control signal by determining whether the pulse period of the at least one of the pulse signals that were received in the remote control signal is one of predetermined pulse periods and by determining whether the pulse width of the at least one of the pulse signals that were received in the remote control signal is one of predetermined pulse widths when the change in the logic level is due to predetermined either one of a falling pulse signal and a rising pulse signal; and interpreting the remote control signal as a bit signal if there is no error in the remote control signal.

\* \* \* \* \*